United States Patent
DiStefano et al.

(10) Patent No.: US 7,031,159 B2
(45) Date of Patent: Apr. 18, 2006

(54) PARALLEL HEAT EXCHANGER FOR A COMPONENT IN A MOBILE SYSTEM

(75) Inventors: Eric DiStefano, Livermore, CA (US);
Ravi S. Prasher, Tempe, AZ (US);
Himanshu Pokharna, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/070,700

(22) Filed: Mar. 1, 2005

(65) Prior Publication Data

US 2005/0146852 A1 Jul. 7, 2005

Related U.S. Application Data

(63) Continuation of application No. 10/335,425, filed on Dec. 30, 2002, now Pat. No. 6,903,930.

(51) Int. Cl.
*H05K 7/20* (2006.01)
(52) U.S. Cl. ............... 361/700; 165/104.33; 174/15.2; 361/695
(58) Field of Classification Search ............... 165/80.3, 165/104.33, 121, 122, 185, 104.21; 174/15.1–15.2; 361/687–688, 694–695, 701–703, 698–699, 361/715; 257/715, 722
See application file for complete search history.

(56) References Cited

U.S. PATENT DOCUMENTS

| 6,105,662 | A | 8/2000 | Suzuki | ................... 165/104.33 |
| 6,226,178 | B1 | 5/2001 | Broder et al. | ............... 361/687 |
| 6,400,565 | B1 | 6/2002 | Shabbir et al. | ............. 361/687 |
| 6,437,983 | B1 | 8/2002 | Machiroutu et al. | ........ 361/700 |
| 6,712,129 | B1 | 3/2004 | Lee | ....................... 165/104.21 |
| 6,903,930 | B1 * | 6/2005 | DiStefano et al. | .......... 361/700 |

\* cited by examiner

*Primary Examiner*—Gregory D Thompson
(74) *Attorney, Agent, or Firm*—Kenyon & Kenyon LLP

(57) ABSTRACT

A system and a method for using parallel heat exchangers to disperse heat from a mobile computing system are disclosed. In one possible embodiment, multiple heat exchangers are thermally coupled to a thermal attach platform. Multiple remote heat exchangers may be thermally coupled to the thermal attach platform using a heat pipe for each remote heat exchanger or a single heat pipe for all the remote heat exchangers. In one embodiment, the thermal attach platform may be a copper block or a heat pipe chamber. An air circulation unit may be coupled adjacent to each remote heat exchanger. Direct attachment heat exchangers may be directly attached to the thermal attach platform. An air circulation unit, such as a fan, may be coupled adjacent to the direct attachment heat exchanger, either vertically or horizontally.

21 Claims, 4 Drawing Sheets

US 7,031,159 B2

PARALLEL HEAT EXCHANGER FOR A COMPONENT IN A MOBILE SYSTEM

RELATED APPLICATIONS

This application is a Continuation of U.S. Ser. No. 10/335,425 filed on Dec. 30, 2002 now U.S. Pat. No. 6,903,930.

BACKGROUND INFORMATION

The present invention relates to thermal management in computer systems. More specifically, embodiments of the present invention relate to heat exchangers for mobile systems.

The movement of electrons within the electrical components of a computer system causes a great deal of heat to be generated. Unless the heat is dissipated, it will accumulate, causing damage to the system. Such damage may include the warping of the electrical components and possible fire hazards. Mobile systems have certain geometric spacing considerations that make heat dispersion more difficult than large systems.

One current method for dispersing the heat generated by an electrical component is to directly attach a heat exchanger to the component that needs cooling. A thermal attach platform coupled to the top of the component draws the heat up from the component. The thermal attach platform may be a copper block or plate, copper being an excellent heat conductor. The direct attachment heat exchanger may include a set of fins attached to the thermal attach platform on the side opposite the component. An air circulation unit is coupled to the direct attachment heat exchanger. The air circulation unit may be a fan or some other method for moving air across the fins of the direct attachment heat exchanger.

An alternative method for dispersing the heat generated by an electrical component is to thermally couple the electrical component to a remote heat exchanger. The remote heat exchanger is located remotely from the electrical component, allowing for the heat dispersion system to be arranged to fit the computing system.

A method for greater heat dispersal than either the direct attachment heat exchanger and the remote heat exchanger is needed.

DETAILED DESCRIPTION

A system and a method for using parallel remote heat exchangers to disperse heat from a mobile computing system are disclosed. In one possible embodiment, parallel heat exchangers are thermally coupled to a thermal attach platform. Multiple remote heat exchangers may be thermally coupled to the thermal attach platform using a heat pipe for each remote heat exchanger or a single heat pipe for all the remote heat exchangers. In one embodiment, the thermal attach platform may be a copper block or a heat pipe chamber. An air circulation unit may be coupled adjacent to each remote heat exchanger. A direct attachment heat exchanger may be directly attached to the thermal attach platform. An air circulation unit, such as a fan, may be coupled adjacent to the direct attachment heat exchanger, either vertically or horizontally.

Figure 1:
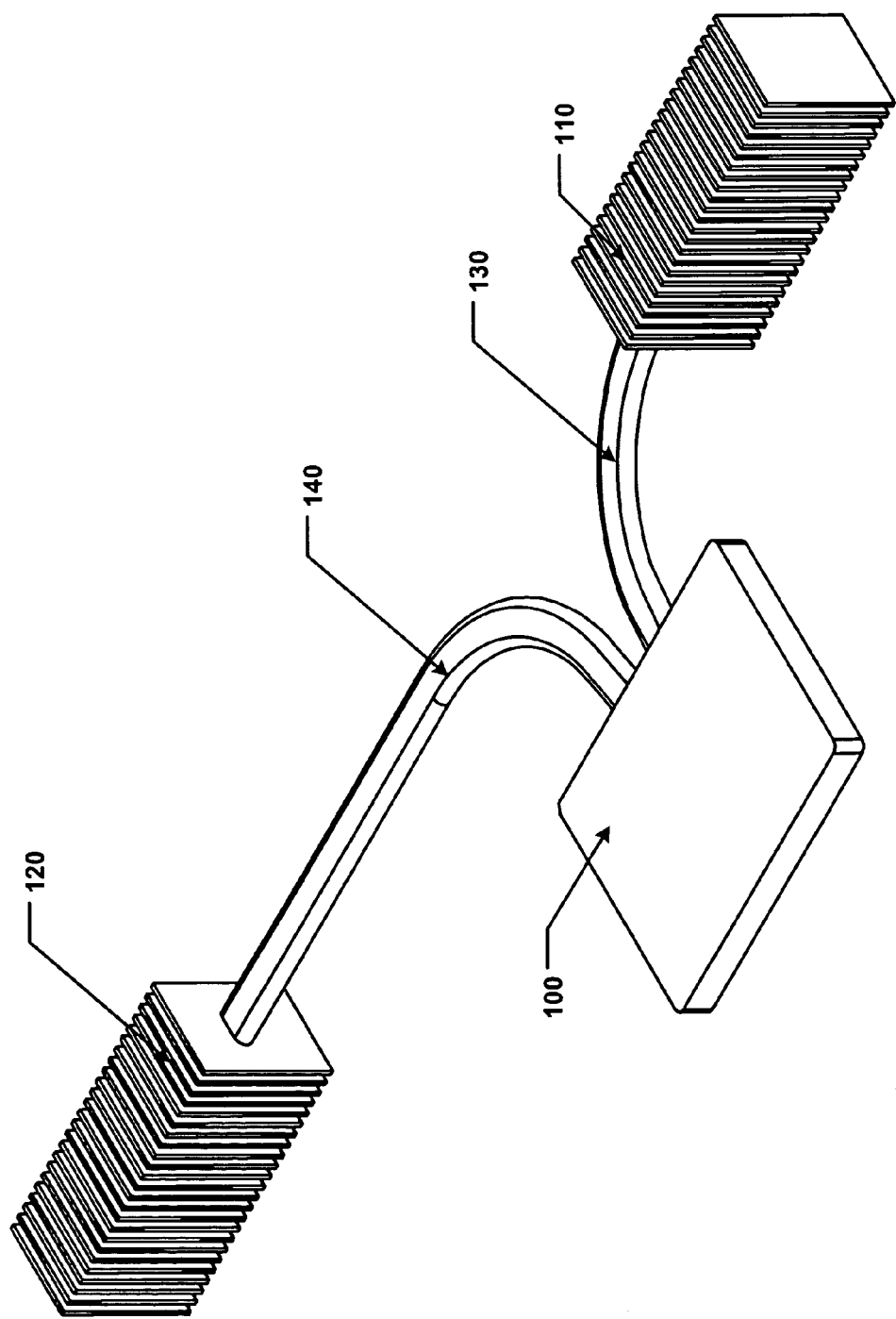
FIG. 1 provides an illustration of one embodiment of a dual parallel heat exchanger heat dispersal system.

FIG. 1 illustrates one embodiment of a parallel heat exchanger heat dispersal system. In one embodiment, a thermal attach platform 100 is coupled to the electrical component (e.g. in a mobile system) that needs cooling. The thermal attach platform 100 may be coupled atop the component by screws affixed directly to the component. The thermal attach platform 100 may be a metal block or plate, such as copper or any other material that transmits heat energy efficiently. In one embodiment, a first remote heat exchanger 110 is coupled to the side of the thermal attach platform 100 that is opposite the component. In one embodiment, the heat exchanger 110 includes of a series of heat fins that spread the heat energy over an area accessible by circulating air. The circulating air carries the heat energy away from the exchanger and away from the component. In one embodiment, a second remote heat exchanger 120 is thermally coupled to the thermal attach platform 100. The first remote heat exchanger 110 and the second remote heat exchanger 120 work in parallel to disperse heat energy from the component. A first heat pipe 130 may be used to thermally couple the first remote heat exchanger 110 to the thermal attach platform 100, while a second heat pipe 140 may be used to thermally couple the second remote heat exchanger 110 to the thermal attach platform 100. Alternately, the second remote heat exchanger 120 may be thermally coupled to the thermal attach platform 100 by the same heat pipe used by the first remote heat exchanger 110. The first remote heat exchanger 110 may have a series of heat fins surrounding an end of the first heat pipe 130 and the second remote heat exchanger 120 may have a series of heat fins surrounding an end of the second heat pipe 140. An alternate method of transporting heat from the thermal attach platform to the remote heat exchangers may also be used, e.g. a circulating liquid loop.

Figure 2:
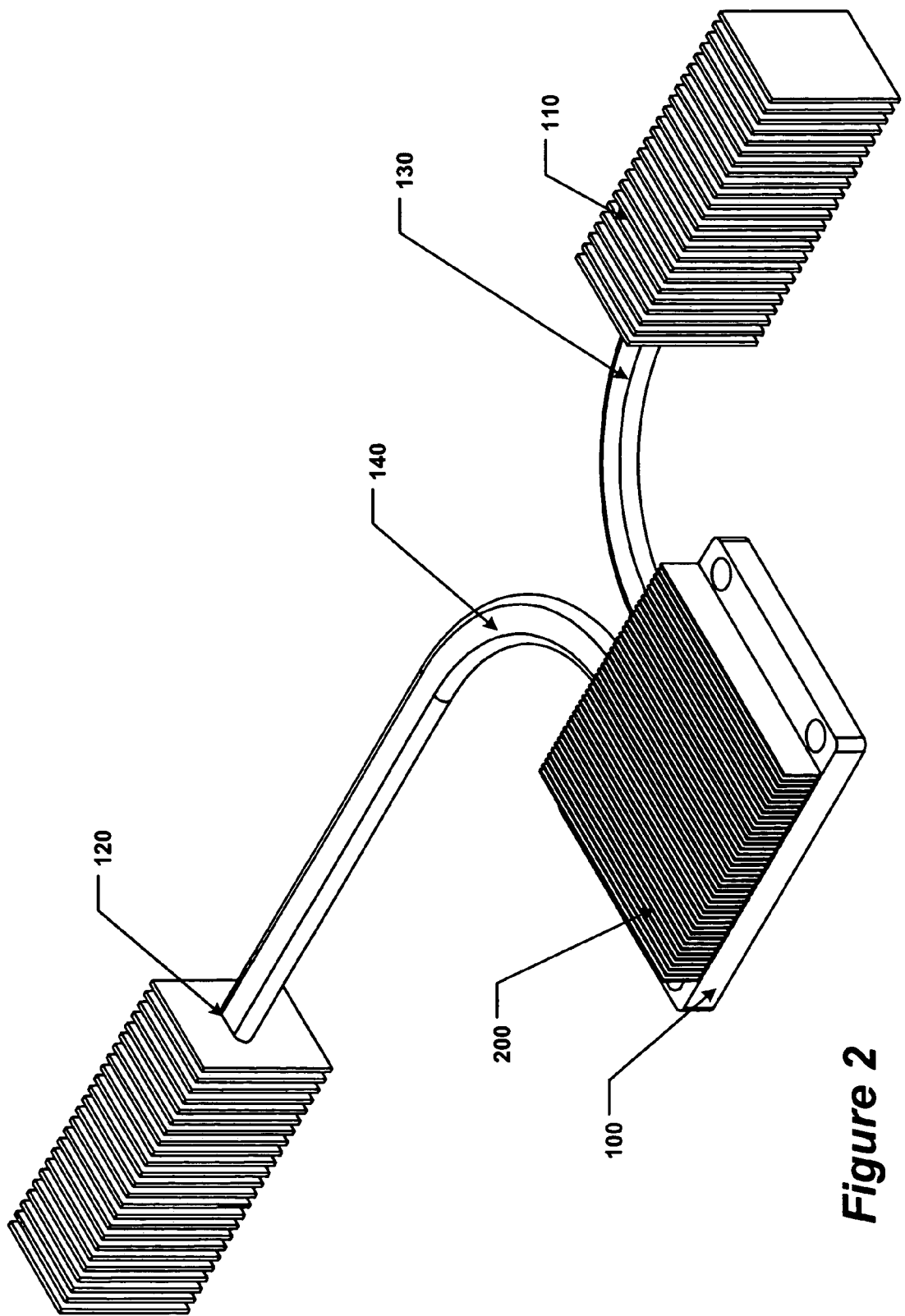
FIG. 2 provides an illustration of one embodiment of parallel remote heat exchanger heat dispersal system with a direct attachment heat exchanger according to the present invention.

FIG. 2 illustrates an embodiment of a parallel remote heat exchanger heat dispersal system with a direct attach heat exchanger 200. In addition to the first remote heat exchanger 110 and the second remote heat exchanger 120, a direct attach heat exchanger 200 is thermally coupled to the thermal attach platform 100. Alternately, if no second remote heat exchanger 120 is present, the direct attach heat exchanger 200 may act as the second parallel heat exchanger to the first remote heat exchanger 110.

Figure 3E:
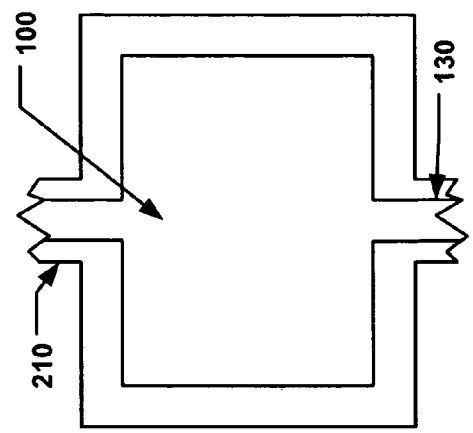
FIGS. 3a–e provides illustrations of different embodiments of a thermal attach platform according to the present invention.
Figure 3C:
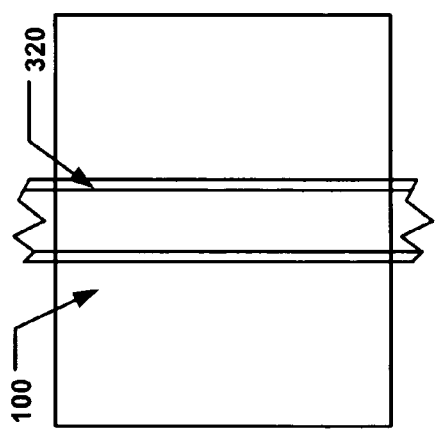
Figure 3D:
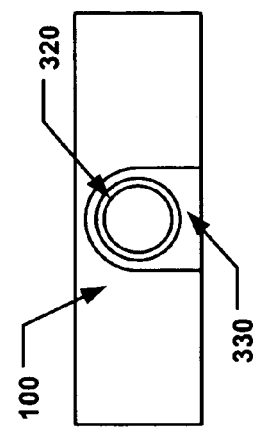
Figure 3A:
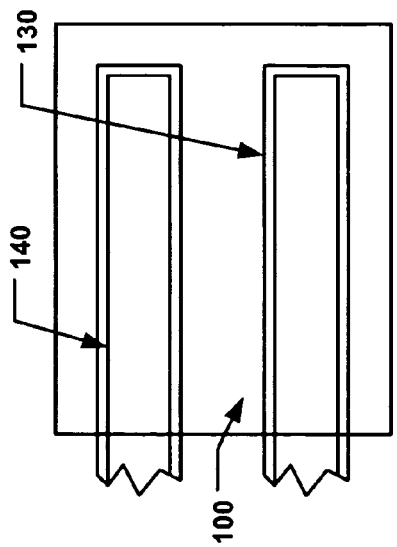
Figure 3B:
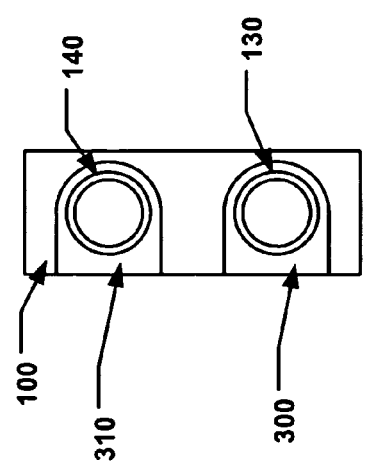

FIGS. 3a–e illustrates different embodiments of a thermal attach platform according to the present invention. FIG. 3a shows a top cross-section and FIG. 3b shows a side cross-section of a thermal attach platform 100 thermally coupled by the first heat pipe 130 to the first remote heat exchanger 110 (not shown) and by the second heat pipe 140 to the second remote heat exchanger 120 (not shown). Each heat pipe may be inserted directly into the thermal attach platform 100. In one embodiment, a first thermally conductive interface 300, such as a copper covering, surrounds the first heat pipe 130 and a second thermally conductive interface 310 surrounds the second heat pipe 140. Each heat pipe may be a metal pipe, such as a copper pipe, that contains a liquid, such as water. The liquid is converted by the heat energy into a vapor in the heat pipe. The vapor carries the heat energy to the remote heat exchanger at the end of the heat pipe, where the heat energy is dispersed. The vapor is converted back to liquid, which travels via mesh on the interior of the heat pipe back to the thermal attach platform 100.

FIG. 3c shows a top cross-section and FIG. 3d shows a side cross-section of a thermal attach platform 100 thermally coupled by a single heat pipe 320 to the first remote heat exchanger 110 (not shown) and to the second remote heat exchanger 120 (not shown). In one embodiment, a single thermally conductive interface 330 covers the single heat pipe 320. The single heat pipe 320 thermally couples the first remote heat exchanger 110 to one end of the thermal attach block 100, passes through the thermal attach block 100, and thermally couples the second remote heat exchanger 120 to the opposite end of the thermal attach block 100. The liquid in the heat pipe 302 collects in the portion of the heat pipe 320 within the thermal attach block 100, where the gathered heat energy converts the liquid to a vapor.

FIG. 3e shows a top cross-section of a thermal attach platform 100, wherein the thermal attach platform 100 is itself a heat pipe chamber. The heat pipe chamber 100 may be a chamber made of thermally conductive material, such as copper, containing a vapor, such as water vapor, which absorbs the heat produced by the component to which it is attached. In one embodiment, the first heat pipe 130 and the second heat pipe 140 are joined to the heat pipe chamber. As the vapor is heated, the vapor expands out towards the first remote heat exchanger 110 and the second remote heat exchanger 120 via the first heat pipe 130 and the second heat pipe 140.

Figure 4:
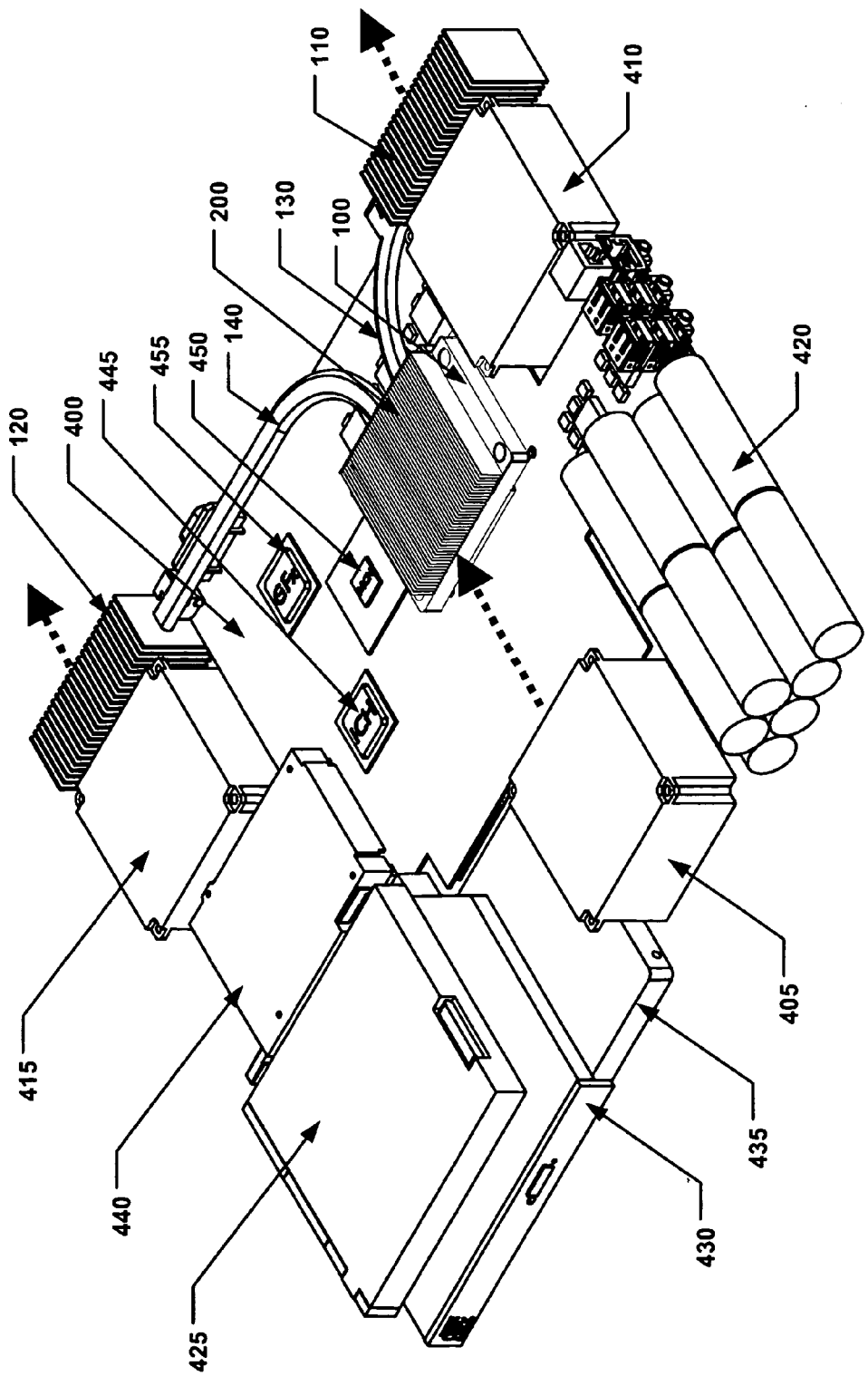
FIG. 4 provides an illustration of one embodiment of the parallel remote heat exchanger heat dispersal system and its interaction with a mobile system according to the present invention.

FIG. 4 illustrates one embodiment of the parallel remote heat exchanger heat dispersal system and its interaction with a mobile system according to the present invention. In one embodiment, the thermal attach platform 100 is coupled to a mobile system motherboard 400 above a mobile system component that needs cooling, such as a central processing unit. The first remote heat exchanger 110 and the second remote heat exchanger 120 may be coupled to the motherboard 400 near its edges. In one embodiment, a first air circulation unit 405, such as a fan, is positioned adjacent to the direct attachment heat exchanger 200 so as to circulate air through the direct attachment heat exchanger 200. In a further embodiment, a first air circulation unit 410 is positioned adjacent to the first remote heat exchanger 110 so as to circulate air through the first remote heat exchanger 110. A second air circulation unit 415 may be positioned adjacent to the second remote heat exchanger 120 so as to circulate air through the second remote heat exchanger 120. Each of the air circulation units may be vertically adjacent or horizontally adjacent to their respective heat exchangers. In alternate embodiments, other components may be attached to the motherboard 400, such as a battery 420, a floppy disk drive 425, an optical disk drive 430, a hard disk drive 435, a personal computer (PC) card slot 440, an input/output control hub 445, a memory controller hub 450, or a graphic effects chip 455.

Although several embodiments are specifically illustrated and described herein, it will be appreciated that modifications and variations of the present invention are covered by the above teachings and within the purview of the appended claims without departing from the spirit and intended scope of the invention.

What is claimed is:

1. A heat exchange system, comprising:
   a thermal attach platform to be coupled to a component of a computing system;
   a first remote heat exchanger thermally coupled to the thermal attach platform; and
   a direct attach heat exchanger thermally coupled to the thermal attach platform in parallel with the first heat exchanger.

2. The heat exchange system of claim 1, further comprising:
   a first heat pipe to thermally couple the first remote heat exchanger to the thermal attach platform.

3. The heat exchange system of claim 1, wherein a first air circulation unit is positioned adjacent to the direct attachment heat exchanger.

4. The heat exchange system of claim 3, wherein the first air circulation unit is vertically adjacent to the direct attachment heat exchanger.

5. The heat exchange system of claim 3, wherein the first air circulation unit is horizontally adjacent to the direct attachment heat exchanger.

6. The heat exchange system of claim 1, wherein the thermal attach platform is a metal block.

7. The heat exchange system of claim 1, wherein the thermal attach platform is a heat pipe chamber.

8. A computing system, comprising:
   a base to support components for the mobile computing system;
   a processing unit attached to the base;
   a thermal attach platform to be coupled to the processing unit;
   a first remote heat exchanger thermally coupled to the thermal attach platform; and
   a direct attach beat exchanger thermally coupled to the thermal attach platform in parallel with the first heat exchanger.

9. The computing system of claim 8, further comprising:
   a first heat pipe to thermally couple the first remote heat exchanger to the thermal attach platform.

10. The computing system of claim 8, further comprising a first air circulation unit positioned adjacent to the direct attachment heat exchanger.

11. The computing system of claim 10, wherein the first air circulation unit is vertically adjacent to the direct attachment heat exchanger.

12. The computing system of claim 10, wherein the first air circulation unit is horizontally adjacent to the direct attachment heat exchanger.

13. The computing system of claim 10 further comprising a second air circulation unit positioned adjacent to the first remote heat exchanger.

14. The computing system of claim 8, wherein the thermal attach platform is a heat pipe chamber.

15. A method, comprising:
   coupling a thermal attach platform to a component of a mobile computing system;
   thermally coupling a first remote heat exchanger to the thermal attach platform; and
   thermally coupling a direct attach heat exchanger to the thermal attach platform in parallel with the first heat exchanger.

16. The method of claim 15, further including:
coupling the first remote heat exchanger to the thermal attach platform via a first heat pipe.

17. The method of claim 15, further including positioning a first air circulation unit adjacent to the direct attachment heat exchanger.

18. The method of claim 17, wherein the first air circulation unit is vertically adjacent to the direct attachment heat exchanger.

19. The method of claim 17, wherein the first air circulation unit is horizontally adjacent to the direct attachment heat exchanger.

20. The method of claim 17, further including:
positioning a second air circulation unit adjacent to the first remote heat exchanger.

21. The method of claim 15, wherein the thermal attach platform is a vapor chamber.

* * * * *